June 22, 1965 B. L. JONES ETAL 3,191,070
TRANSISTOR AGC DEVICE
Filed Jan. 21, 1963

INVENTORS
BRIAN L. JONES
GARY W. PARKER
BY
Lippincott, Ralls & Hendricson
ATTORNEYS United States Patent Office 3,191,070
Patented June 22, 1965

3,191,070
TRANSISTOR AGC DEVICE

Brian L. Jones, Mountain View, and Gary W. Parker, Sunnyvale, Calif., assignors to Fairchild Camera and Instrument Corp., Syosset, N.Y., a corporation of Delaware Filed Jan. 21, 1963, Ser. No. 252,727
13 Claims. (Cl. 307—88.5)

This invention relates to a new AGC (automatic gain control) device, more particularly to an AGC device using a special AGC transistor with a characteristic frequency which drops appreciably in value as the collector current increases, without appreciable change in D.-C. collector voltage.

AGC circuits are prevalent in television, FM receivers, and other similar equipment, where it is important to maintain an output having a constant amplitude in spite of signal strength changes. In a television receiver, for example, when shifting from a channel having a weak signal to one having a strong signal, it is desirable that the output amplitude remain constant—an AGC device is used to achieve this result. In a television receiver such a device is generally located in the I-F and R-F amplifiers. In response to a change in D.-C. current from the detector output amplitude, the AGC device functions as an offsetting mechanism so that the A.-C. signal amplitude of the AGC device is constant in spite of variations in input signal strength.

There are two types of AGC devices—forward and reverse. In a reverse AGC device, as A.-C. input signal amplitude is increased, A.-C. current from the collector of the AGC transistor is reduced to compensate at the output of the AGC device for the increase in A.-C. input current. If the A.-C. input signal becomes too large, however, the value of the output may become so small that it is comparable to the D.-C. biasing currents on the transistor, causing the transistor to be switched on and off, and resulting in signal distortion. Forward AGC, which does not produce this type of distortion, is therefore the preferred method because of its increased signal-handling capability. In forward AGC devices, in contrast to the reverse type, as the A.-C. signal amplitude is increased, collector current is also increased; in consequence, the device can handle very large signals without having the A.-C. signal strength become comparable to the D.-C. bias voltages.

A conventional forward AGC transistor is operated at a constant D.-C. load. For this reason, even though its large signal-handling capability may be satisfactory, it is still unsatisfactory for small signals. When the input signal amplitude is reduced, collector output current of the AGC transistor drops, causing a concomitant drop in its D.-C. collector voltage. This drop in D.-C. collector voltage causes a change in the capacitances in the transistor, which in turn results in detuning or distortion of the waveform of the signal.

The present invention provides a forward AGC transistor device wherein collector current changes in response to input signal change without appreciable change in D.-C. collector voltage. These devices, therefore, not only have the increased signal handling capability of forward AGC devices, but also are relatively distortion-free even with substantial increase in input signal amplitude.

Briefly, the AGC devices of this invention comprise a transistor having an emitter, a base, and a collector. The signal is sent into the base of the transistor, and the gain-controlled output signal appears at the collector. The transistor has a characteristic frequency ($f_T$) which drops appreciably in value as the D.-C. collector current increases substantially, without causing any appreciable change in D.-C. collector voltage. The increase in collector current required to produce such an appreciable fall-off of $f_T$ (e.g., down to about 30 percent or less of its original value) is less than about a ten-fold increase. The fall-off of $f_T$ causes a reduction in the transistor's A.-C. power gain (from base to collector) because this A.-C. power gain is proportional to $(f_T)^2$. This is characteristic of certain transistors, and has been described in the art. In the past, however, the fall-off of power has been considered a very undesirable feature. In this invention, the fall-off is converted into a useful characteristic.

The structure of the transistors of this invention is one of the very important aspects. Specific geometric relationships must obtain in order to achieve the desired amount of fall-off of $f_T$ with $I_{c(d-c)}$. A ratio of emitter perimeter to emitter area of at least two mils per square mil is essential. Furthermore, the collector should be lightly doped in order to obtain the requisite fall-off of $f_T$ with D.-C. collector current. The AGC device of this invention may be better understood from the following more detailed description, and the drawings, in which.

Figures 1, 2:
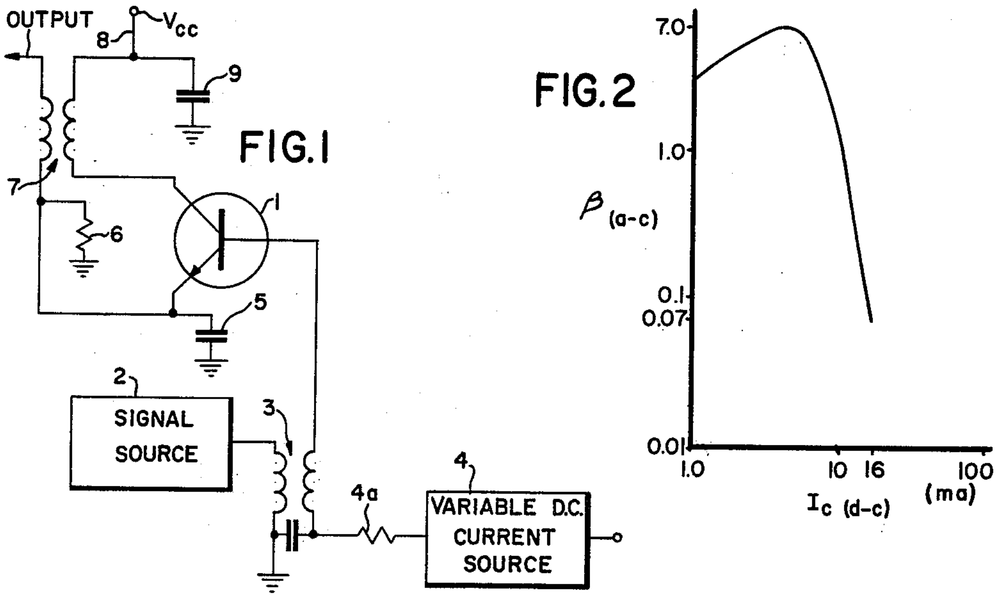
FIG. 1 is a schematic diagram of an AGC device of one embodiment of the invention.
FIG. 2 is a graph showing the A.-C. current gain as a function of collector current of a representative transistor used in the invention.

Referring to FIG. 1, AGC transistor 1 is connected as shown in an AGC circuit. The A.-C. input signal 2, whose gain is to be controlled by the device, is coupled to the base of transistor 1 through transformer 3. In most conventional FM and television receivers, the detector provides a D.-C. signal which varies in direct proportion to the amplitude of the A.-C. signal received. This D.-C. signal, herein called a control signal, is used by the AGC device of this invention as a means of varying the characteristic frequency $f_T$ of the AGC transistor This D.-C. control signal is shown as variable D.-C. current supply 4, and is fed into the base of transistor 1 (through resistor *4a* and the secondary of transformer 3) along with the A.-C. input signal 2. The emitter of transistor 1 is grounded through D.-C. blocking capacitor 5 and resistor 6. When the A.-C. signal 2 increases, causing a concomitant increase in the D.-C. control signal from the detector of the receiver, the $f_T$ of the AGC transistor falls off. Since the A.-C. current gain $\beta_{a-c}$ of the transistor is proportional to this characteristic frequency $f_T$, the $\beta_{a-c}$ of the transistor 1 falls off proportionately. Because of the transistor's reduced current gain, the output signal amplitude at the collector is reduced, compensating, at least in part, for the increased input signal amplitude and effecting the gain control. The output A.-C. signal, appearing at the collector whose gain has been controlled is then sent through output coupling transformer 7. AGC transistor 1 is forward-biased by a positive voltage $V_{cc}$ at point 8. The collector is also connected to ground through D.-C. blocking capacitor 9.

As an example of this operation, assume that the 100 mc. A.-C. signal current is 1 $\mu$a., and that the D.-C. control signal current from the detector associated with a 1 $\mu$a. A.-C. output signal in the receiver is 0.1 ma. If the A.-C. current gain ($\beta_{a-c}$) of the AGC transistor operating with a 0.1 ma. D.-C. control current at 100 mc. is 7, then the A-C. collector current is 7 $\mu$a. If the D.-C. current gain of the device ($\beta_{d-c}$) is 40, then the D.-C. collector current is 4 ma.

Now suppose that the A.-C. signal current fed to the base of transistor 1 rises from its original value of 1 $\mu$a. to a new value of 0.1 ma.—a hundred-fold increase. Suppose also that the proportionate increase in the D.-C. control current (as described above) associated with such a hundred-fold increase in A.-C. signal current is eight-fold. The new D.-C. control current at the base of transistor 1 is then 0.8 ma. The D.-C. current gain ($\beta_{d-c}$) of the transistor falls off much less than A.-C. current gain ($\beta_{a-c}$) in response to an increase in the D.-C. control current signal—to about 20, in fact, so that the overall increase in the D.-C. collector current is four-fold with the eight-fold D.-C. base current increase. This results in a 16 ma. D.-C. collector current.

When the A.-C. signal strength was increased 100-fold, as described above, the D.-C. collector current $I_c$ increased from 4 ma. to 16 ma. Referring now to FIG. 2, it may be seen that as a result of this increase $\beta_{a-c}$ falls from 7 to 0.07. Such a reduced $\beta_{a-c}$ means that with a 0.1 ma. A.-C. signal input current, the A.-C. collector output current is 7 $\mu$a., and therefore, although the A.-C. input signal current has risen 100-fold, from 1 $\mu$a. to 0.1 ma. (because of the increase in signal strength), the A.-C. output signal current of the AGC device of the invention has remained unchanged at 7 $\mu$a. The decrease in $\beta_{a-c}$, consequently, has compensated for the increase in signal amplitude, resulting in the desired gain control.

Figure 3:
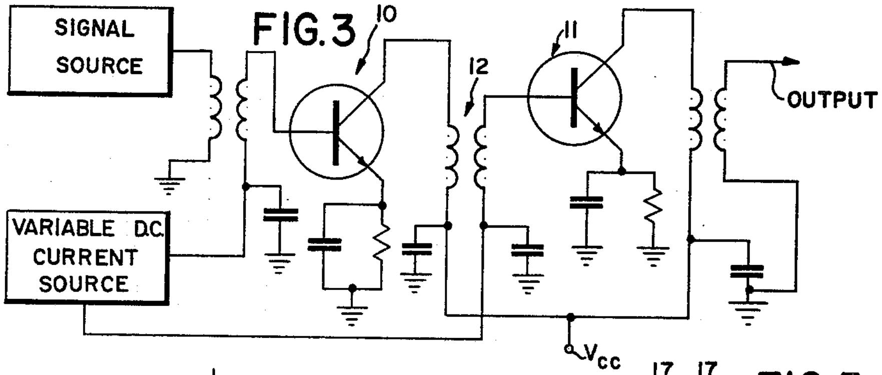
FIG. 3 is a schematic circuit diagram of a double AGC device of the invention.

In many instances, however, one transistor is not sufficient to maintain a constant output signal amplitude, particularly where wide variations in input level are encountered. In such cases, the AGC devices are cascaded, as shown in FIG. 3, to make a double or triple (or higher multiple) AGC device. After transistor 10 has compensated to some extent for a given change in signal level, transistor 11, which receives the output signal from transistor 10 through coupling transformer 12, further reduces the output level. The number and characteristics of the transistors are so chosen that the final output of the AGC device has a relatively constant signal amplitude in spite of any variations in input signal level likely to be encountered in the system for which the device was designed.

Proper choice of AGC transistors for the invention is very important. Referring now to FIG. 2, the power dissipation at the point where $I_{c(d-c)}$ is maximum must lie within the capacity of the transistor. Since power dissipation is, in part, a function of the operating voltage $V_{c(d-c)}$, it would seem that any power limitations might be avoided by selecting a low enough operating D.-C. voltage; however, it is necessary that this voltage be kept sufficiently high that the transistor never reaches the saturation region. Were it allowed to reach saturation condition, the output of the AGC device would become distorted as the signal switched the transistor in and out of forward bias condition. Given a suitable $V_{c(d-c)}$ and a known $I_{c(d-c)}$ maximum, however, the maximum power dissipation may be determined; the device must be capable of operation at this power dissipation.

Most important is the fact that, in order to have a sufficient amount of $f_T$ fall-off with D.-C. collector current, the device should have a small emitter area. A large emitter perimeter is required, moreover, to reduce the base spreading resistance which would otherwise attenuate the signal fed into the base. The amount of fall-off of $f_T$ with current has been found to be a function of the ratio of these two parameters. This ratio should reach the proportion of at least 2 mils perimeter per square mil of area. Higher ratios are preferred—i.e., at least 5:1—but practical limits are reached at a ratio of about 10:1, because of limitations in the photoresist diffusion techniques (known in the art) used to form the extremely small emitters. An emitter area less than approximately 5 sq. mils is suitable; an area less than approximately 3 sq. mils is preferred. A strip configuration is used for the emitter to achieve the proper perimeter/area ratio, because a thin strip has the optimum ratio of perimeter to area for this purpose.

Finally, a low collector doping level, preferably less than about $2\times10^{15}$ atoms per cc., should also be used to obtain the requisite fall-off. The collector doping level and the emitter surface area are so related that the necessary fall-off rate of $f_T$ with $I_{c(d-c)}$ is obtained more easily when a very small emitter surface area is employed because the collector doping level becomes less critical.

Although operative devices have been made with single emitters, a particularly favorable fall-off curve for $f_T$ with D.-C. collector current can be achieved by the use of multiple emitters. Provision of more than one base contact is also very helpful. The spreading resistance in the base is substantially reduced by base contacts on both sides of each emitter, and in addition a more uniform current injection (from the emitter) is achieved. With a base contact located on only one side of an emitter, the peak $f_T$ occurs only while the emitter is injecting on that side; with base contacts located on both sides, the peak $f_T$ occurs while uniform current density exists all around the emitter, thereby raising the peak $I_c$ and causing faster fall-off of $f_T$ with $I_c$.

Figure 4:
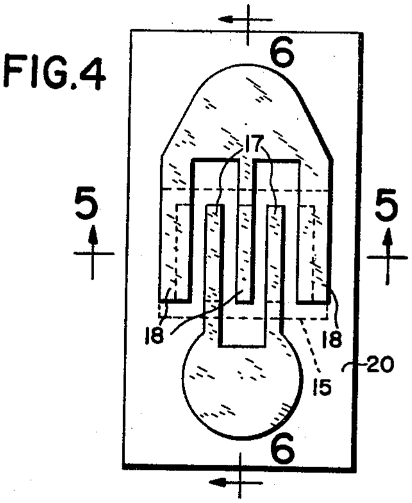
FIG. 4 is a greatly enlarged, somewhat schematic plan view of an AGC transistor of this invention.
Figures 5, 6:
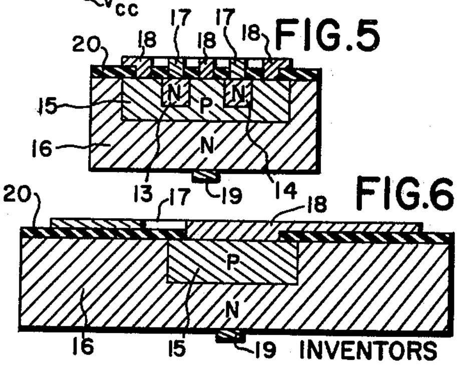
FIG. 5 is a transverse section taken along line 5—5 of FIG. 4.
FIG. 6 is a transverse section taken along line 6—6 of FIG. 4.

In FIGS. 4, 5 and 6 is shown a planar device having N-type emitters 13 and 14. The base 15 is P-type conductivity, and collector 16 is N-type. Emitter contact 17 is approximately coextensive with the surface of emitters 13 and 14 (except for a slight overlap onto the insulation layer), and forms a conductive path between them. Base contact 18 is interdigitated with emitter contact 17. Collector contact 19 is located on the bottom surface of the device in the illustration; it might alternatively be located on the upper surface. The junctions are protected by oxide layer 20, in which openings are etched by processes well known in the art such that metal layers 17 and 18 can make contact with the desired regions of the semiconductor. The method of making the planar device shown may be found in U.S. Patent No. 3,025,589, assigned to the same assignee as this invention. The method of forming conductive strips 17 and 18 (particularly lead 17, which extends partially over oxide layer 20 because it must contact emitters 13 and 14 but not base 15) is shown in U.S. Patent No. 2,891,877, also assigned to the same assignee as this invention.

By way of illustration, and not of limitation, the following specific example is given to illustrate the performance of an AGC transistor such as the device shown in FIGS. 4 and 5.

*Example*

An AGC transistor of the configuration shown in FIGS. 4 and 5 was produced and tested. This transistor had an emitter length of 2.1 mils and width of 0.32 mil, providing an emitter perimeter of 4.9 mils and area of 0.735 sq. mil (a ratio of 6.67:1). The emitter depth was about 1$\mu$. The collector of the transistor was doped with phosphorus, at a concentration of about $10^{15}$ atoms/cc.; the emitters were also doped with phosphorus, at a concentration of about $4\times10^{20}$ atoms/cc.; and the base was doped with boron, at a concentration of about $2\times10^{19}$ atoms/cc.

The device wast connected as shown in FIG. 1, to make an AGC device according to the invention. A constant D.-C. collector voltage of about 10 v. was maintained, and D.-C. collector current was about 4.6 ma.; at this point $f_T$ was about 680 mc. As $I_{c(d-c)}$ increased to 11.5 ma., $f_T$ fell off to about 100 mc., indicating a three-fold increase in D.-C. collector current caused a seven-fold fall-off of $f_T$, approximately. This amount of fall-off was sufficient to produce an appreciable amount of gain control on the input signal; therefore, the AGC transistor used in this example had satisfactory characteristics for the AGC device of the invention.

As will be apparent to one skilled in the art, many modifications may be made in the AGC devices and the AGC transistors themselves. The only limitations to be placed on the scope of this invention, therefore, are those set forth in the following claims.

What is claimed is:

1. An AGC device comprising:
a transistor having an emitter, a base, and a collector, said transistor having a characteristic frequency which drops appreciably in value when the D.-C. collector current is increased by a factor of less than ten without an appreciable change in the D.-C. collector voltage;
biasing means forward biasing said transistor for current conduction between collector and emitter, said biasing means holding said collector at a constant D.-C. voltage;
input means coupled to the base of said transistor for passing an A.-C. input signal to the device; and
output means electrically isolated from said input means coupled to the collector of said transistor, whereby the A.-C. current gain from the input to the output is reduced as a result of the said drop in characteristic frequency.

2. The AGC device of claim 1 wherein said characteristic frequency drops to less than about thirty percent of its original value as a result of said increase in collector current.

3. An AGC device comprising:
a transistor having an emitter, a base, and a collector, said transistor having a characteristic frequency which drops appreciably in value when the D.-C. collector current is increased by a factor of less than ten without an appreciable change in D.-C. collector voltage;
input means for coupling a D.-C. and A.-C. signal to the base of said transistor, said D.-C. signal strength changing in proportion to a change in said A.-C. signal strength;
biasing means forward biasing said transistor for conduction of current between collector and emitter, said biasing means holding said collector at a constant D.-C. voltage; and
output means electrically isolated from said input means for coupling an output to the collector of said transistor, whereby the A.-C. current gain from input to output is reduced in proportion to said increase in D.-C. collector current as a result of said drop in charatceristic frequency.

4. A plurality of cascaded AGC devices of claim 3 wherein the A.-C. output signal of one device is coupled to the base of the transistor of the next device, thereby achieving the compound reduction in current gain of all of said devices at the output of the last device in said cascade.

5. An AGC device comprising:
a transistor having an emitter, a base, and a collector, said transistor having a characteristic frequency which drops appreciably in value when the D.-C. collector current is increased by a factor of less than ten without an appreciable change in D.-C. collector voltage;
biasing means forward biasing said transistor for current between collector and emitter, said biasing means holding said collector at a constant D.-C. voltage;
a transformer having a primary and a secondary winding;
input means coupling said secondary winding to the base of said transistor;
means coupling an A.-C. input signal to the primary winding of said transformer;
output means electrically isolated from said input means coupling a D.-C. input signal through the secondary winding of said transformer to the base of said transistor, said D.-C. signal strength changing in proportion to a change in said A.-C. signal strength; and
means for coupling an output to the collector of said transistor, whereby the A.-C. current gain from input to output is reduced in proportion to said increase in D.-C. collector current as a result of said drop in characteristic frequency.

6. A plurality of cascaded AGC devices of claim 5 wherein the A.-C. output signal of one device is coupled to the primary of the transformer of the next device, thereby achieving the compound reduction in current gain of all of said devices at the output of the last device in said cascade.

7. An AGC transistor comprising:
an emitter having a perimeter/area ratio of at least about two mils per square mil, and an area less than about five square mils;
a base; and
a collector having an average charge carrier concentration of less than about $2\times10^{15}$ atoms per cc., wherein the characteristic frequency of said transistor drops appreciably in value when the D.-C. collector current is increased by a factor of less than ten without an appreciable change in D.-C. collector voltage.

8. The AGC transistor of claim 7 further defined by said perimeter/area ratio being at least five mils per square mil.

9. An AGC transistor comprising:
a collector having a charge carrier concentration less than about $2\times10^{15}$ atoms/cc.;
a base disposed within said collector forming a common upper surface therewith;
a plurality of strip-like emitters disposed within said base and spaced apart from each other by said base, said emitters forming a common upper surface with said base and said collector, the perimeter/area ratio of each of said emitters being at least about two mils per sq. mil;
means for passing current into each of said emitters;
means for passing current into said base; and
means for receiving current from said collector, wherein the characteristic frequency of said transistor drops appreciably in value when the D.-C. collector current is increased by a factor of less than ten without an appreciable change in D.-C. collector voltage.

10. The AGC transistor of claim 9 further defined by said perimeter/area ratio of each of said emitters being at least five mils per sq. mil.

11. The AGC transistor of claim 10 further defined by said means for passing current into said base region being a plurality of metal electrodes, each in contact with said base region, one of which is located on each side of each of said emitters.

12. The AGC transistor of claim 11 further defined by said means for passing current into each of said emitters being electrodes in contact with each of said emitters.

13. The AGC transistor of claim 12 wherein said emitter electrodes are in contact with each other.

References Cited by the Examiner

UNITED STATES PATENTS

| | | | |
|---|---|---|---|
| 2,855,568 | 10/58 | Lin | 331—109 X |
| 2,889,417 | 6/59 | Maupin et al. | 330—29 X |
| 2,924,760 | 2/60 | Herlet | 317—235 |

OTHER REFERENCES

Electronic Design, "Forward or Reverse Transistor AGC," Sinclair, John C., Oct. 25, 1963, pp. 64–69.

Electronics, "Highlights of Small-Signal Circuit Design," Clark et al., Dec. 6, 1963, pp. 46–50.

JOHN W. HUCKERT, *Primary Examiner.*

ARTHUR GAUSS, *Examiner.*